United States Patent [19]

Uehara et al.

[11] 4,185,237

[45] Jan. 22, 1980

[54] CONTINUOUS MEASUREMENT METHOD AND DEVICE

[75] Inventors: Hiromichi Uehara; Satoshi Arimitsu, both of Sagamihara, Japan

[73] Assignee: Sagami Chemical Research Center, Tokyo, Japan

[21] Appl. No.: 859,516

[22] Filed: Dec. 12, 1977

[30] Foreign Application Priority Data

Dec. 16, 1976 [JP] Japan .................................. 51-149804

[51] Int. Cl.² ............................................ G01R 33/08
[52] U.S. Cl. ..................................... 324/317; 324/319
[58] Field of Search ......... 324/0.5 R, 0.5 MA, 0.5 H, 324/0.5 A

[56] References Cited

U.S. PATENT DOCUMENTS

| | | | |
|---|---|---|---|
| 3,714,551 | 1/1973 | Pajak et al. | 324/0.5 R |
| 4,015,196 | 3/1977 | Moore et al. | 324/0.5 R |

Primary Examiner—M. Tokar
Attorney, Agent, or Firm—Sughrue, Rothwell, Mion, Zinn and Macpeak

[57] ABSTRACT

In a method of measuring substances each exhibiting a derivative peak of the phase sensitive detector (PSD) output at a pair of specific magnetic field intensities by sweeping the field, the magnetic field is switched between the specific magnetic field intensities to obtain only the absorptions at the specific field intensities to thereby substantially reduce the sweeping time as well as to reduce the background drift.

4 Claims, 11 Drawing Figures

4,185,237

CONTINUOUS MEASUREMENT METHOD AND DEVICE

BACKGROUND OF THE INVENTION

This invention relates to a method of measuring the density of material from a derivative absorption spectrum in magnetic field sweep.

One example of such a measurement is a measurement of a gas phase paramagnetic material employing electron paramagnetic resonance (hereinafter abbreviated to "EPR" when applicable).

The measurement of a gas phase paramagnetic material, especially NO and $NO_2$, by an EPR device has been disclosed by Japanese Patent Application Laid Open No. 15489/1974. In the measurement according to the conventional technique disclosed by that application, a sample is placed in an EPR measurement sample tube, and the sample tube is set in an EPR cavity resonator. Thereafter, the EPR spectrum is measured by continuously sweeping the magnetic field while the microwave frequency is maintained unchanged. The density of the paramagnetic material, for instance NO or $NO_2$, is determined from the intensity I of the EPR spectrum obtained. In this case, the period of time necessary for measurement depends on the magnetic field sweep time, and is, in general, relatively long, for instance several minutes. Accordingly, the density of the aimed material in the sample must be maintained unchanged at least for this period of time, and therefore the sample gas is kept in a closed system. Accordingly, the above-described conventional measurement is necessarily of the batch system, and is a non-continuous or intermittent measurement.

If the magnetic field is swept slowly for a period of time T starting at $H_0$ as shown in FIG. 1(a), derivative peaks of the PSD output are observed at the inherent magnetic fields $H_1$ and $H_2$ of the aimed material as shown in FIG. 1(b), and the top peak value $I_1$ and the bottom peak value $I_2$ are observed thereat, respectively. The term "derivative peaks" as used herein merely refers to the peaks of the phase sensitive detector output in a conventional differential-type electron paramagnetic resonance (EPR) device. The difference value I between these two peak values $I_1$ and $I_2$ represents the density of the material. Accordingly, it takes a relatively long period of time T to detect a pair of peak values, and even if the density of a material is continuously varied as shown in FIG. 2, for instance, all that can be measured are incorrect intermittent values indicated by points a, b and c.

SUMMARY OF THE INVENTION

An object of this invention is to eliminate the above-described difficulties accompanying, for instance, the EPR measurement method with the conventional device for measuring the density of a material with a derivative absorption spectrum, thereby to achieve a continuous measurement according to the method thus improved.

The foregoing object can be achieved by basing on the fact that for instance, an EPR absorption spectrum takes place in a particular magnetic field, that is, by removing the existence time of the magnetic fields other than that particular magnetic field.

BRIEF DESCRIPTION OF THE DRAWINGS

FIG. 3b is a graphical representation of the EPR spectrum (PSD output) for the magnetic field intensity values shown in FIG. 3a.

FIG. 4b is an enlarged diagram of one component of FIG. 4a;

DETAILED DESCRIPTION OF THE PREFERRED INVENTION

Figure 1A:
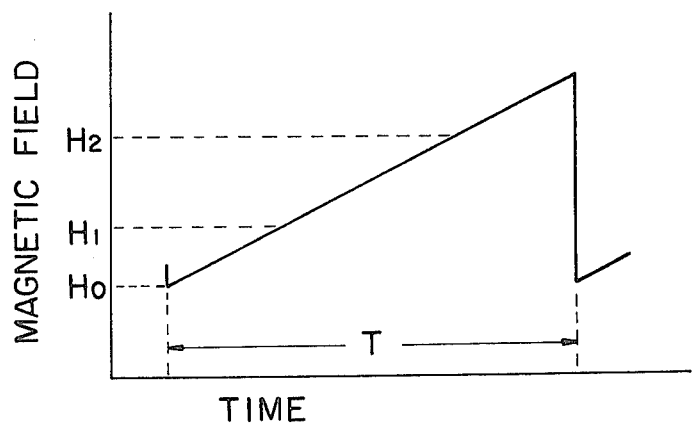
FIG. 1a is a plot of the magnetic field intensity versus time in a conventional EPR system.
Figure 1B:
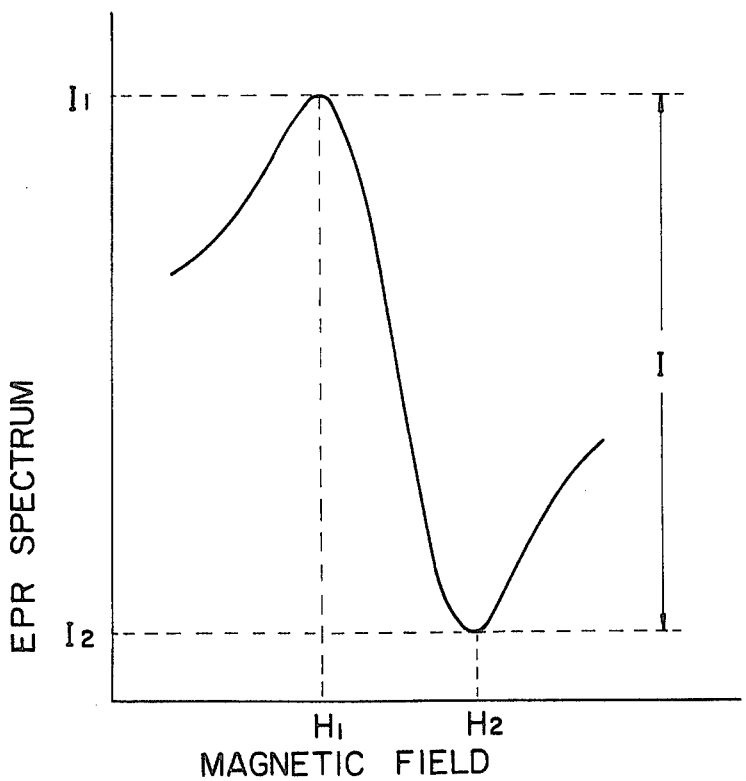
FIG. 1b is a graph of the EPR spectrum (PSD output) versus magnetic field intensity in a conventional EPR system.
Figure 2:
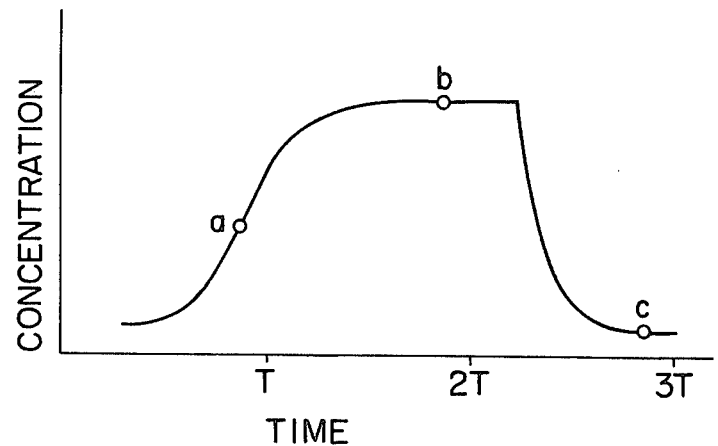
FIG. 2 is a graphical representation indicating a defect of the result of a conventional EPR measurement.

More specifically, referring to FIG. 1(b), the peaks appear at the magnetic field intensities $H_1$ and $H_2$. Therefore, if the values $H_1$ and $H_2$ are known, almost all of the period of time required for magnetic field sweep can be eliminated by switching the magnetic field value between $H_1$ and $H_2$ without carrying out the magnetic field sweep.

The values of the PSD output obtained at the magnetic fields $H_1$ and $H_2$ are processed by a suitable means to provide the difference value therebetween. This difference value represents the density of the paramagnetic material in question. The result obtained by reducing this switching period as much as possible is substantially continuous. As was described before, an object material to be measured is a stable paramagnetic material such as NO or $NO_2$. Since a continuous measurement is available at atmospheric pressure, $NO_2$ is suitable for the measurement according to the method of this invention; however, if NO is maintained under a reduced pressure by a suitable means or it is changed into $NO_2$ by using a NO oxidizing agent or employing an oxidizing method in combination, the continuous measurement of NO can be conducted, of course.

Figure 3A:
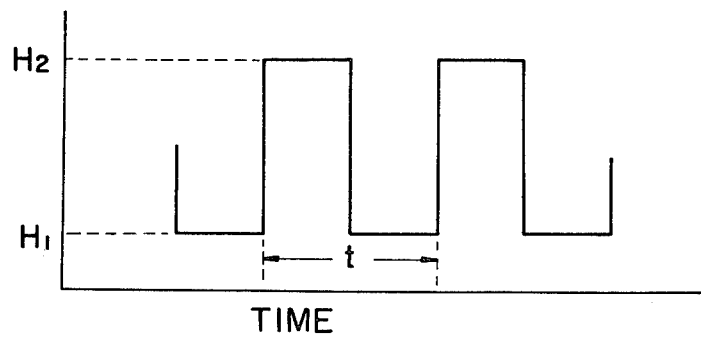
FIG. 3a is a graphical representation of the magnetic field intensity versus time in the EPR system according to the present invention.
Figure 3B:
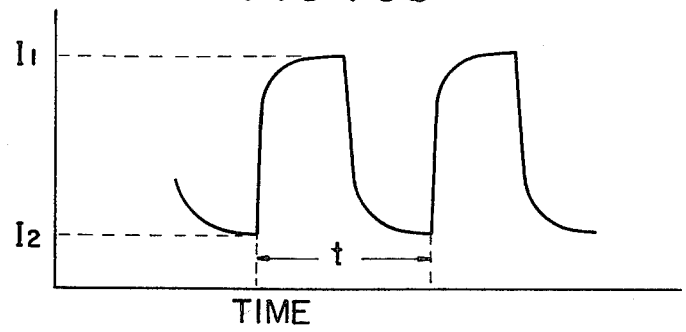

In the method of this invention, the magnetic field is switched as shown in FIG. 3(a). Therefore, the shape of the measured EPR spectrum is as shown in FIG. 3(b). It has been found that a suitable switching period t is of the order of about 0.2 to 0.3 second in practice.

Figure 4A:
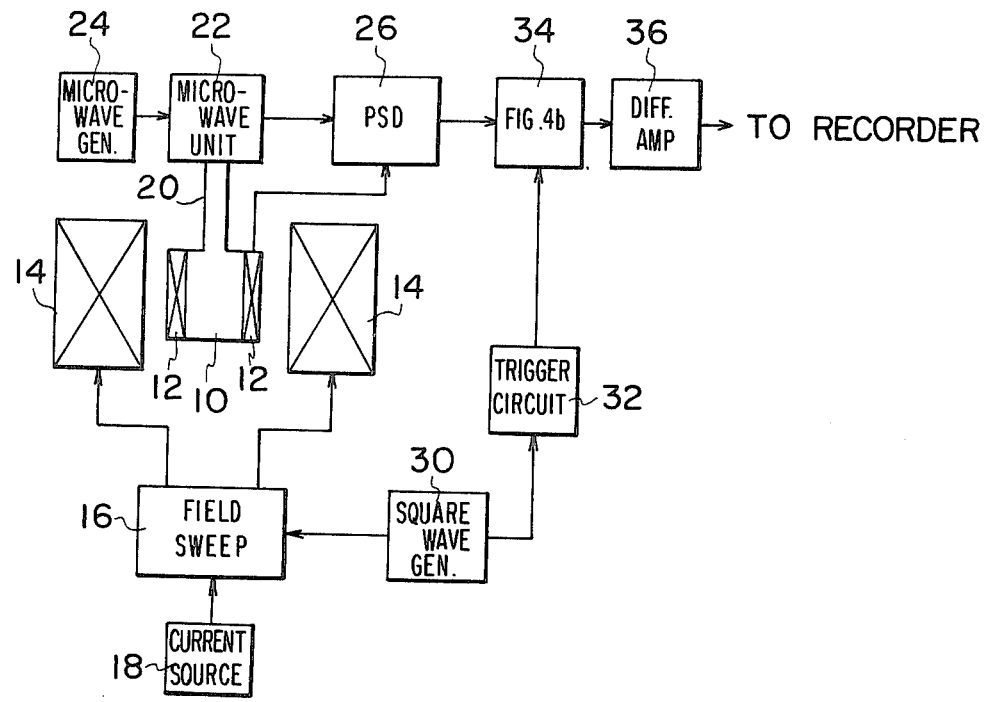
FIG. 4a is a block diagram showing a device for practicing a method according to this invention.
Figure 4B:
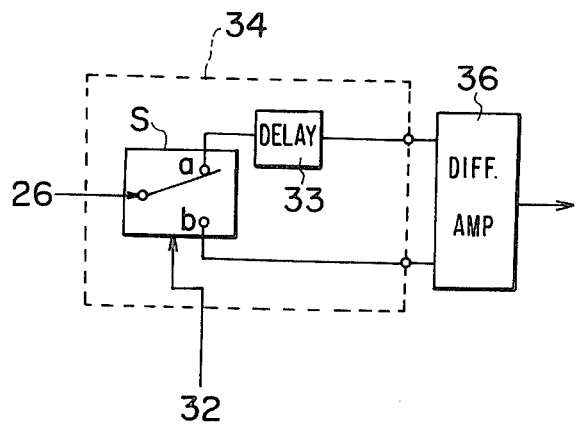

Shown in FIGS. 4a and 4b is an example of a device for practicing the method according to this invention. In the device shown in FIG. 4, a microwave cavity resonator 10, a modulating device 12 made up of Stark electrodes and/or Zeeman coils, electromagnets 14 for generating magnetic fields, a magnetic field sweep section 16 for sweeping a magnetic field with the electromagnets 14, a current source 18 for the magnetic field sweep section 16, a microwave unit 22 including a waveguide 20 for introducing a microwave into the cavity resonator 10, and a microwave generator 24 are conventional one. In addition, a phase sensitive detector (PSD) 26 connected to the modulating device 12 made up of Stark electrodes and/or Zeeman coils is also a conventional one.

In the device shown in FIGS. 4a and 4b, a square wave generator 30 is provided according to this invention. This square wave generator generates a square wave voltage having a relatively low frequency. This square wave voltages serves to switch the exciting currents of the electromagnet coils 14 controlled by the magnetic field sweep section between values which are suitable for alternatively generating predetermined magnetic fields $H_1$ and $H_2$. Thus, the exciting currents are varied in a square wave mode. Therefore, the magnetic field is switched as shown in FIG. 3(a), and in the PSD 26 values corresponding to the peak values shown in FIG. 3(b) are detected.

As was described before, the density of a paramagnetic material is represented by the difference value $(I_1-I_2)$. The difference value is obtained by using a differential amplifier 36, the output of which is recorded by a recorder. However, as there is a difference in time between the generations of the values $I_1$ and $I_2$ (the difference in time being approximately 0.2 second in this example), the differential amplifier can not be directly employed. Therefore, in this example, a trigger circuit 32 operating in snychronization with the square wave generator 30 is employed to divide the output of the PSD 26 into two parts. That is, the armature of the switch S is tripped over to the contact a at the generation time instant of the magnetic field $H_1$, and in the circuit formed by this tripping operation a suitable delay circuit 33 is included which is connected to one input of the differential amplifier 36, whereby the detected value $I_1$ is held until the generation time instant of the magnetic field $H_2$, or until the value $I_2$, is detected by the detector. Upon detection of the value $I_2$, the armature of the switch S is tripped over to the contact b by the operation of the trigger circuit 32, as a result of which the value $I_2$ is applied directly to the other input of the differential amplifier 36. Thus, when the value $I_2$ is detected, this value $I_2$ and the previously detected value $I_1$ are simultaneously applied to the two inputs of the differential amplifier 36, and the difference value therebetween is obtained.

In this example, the switch S and the delay circuit 33 are employed to make the output of the PSD 26 suitable for the input of the differential amplifier; however, these elements may be replaced by an integrator.

Figure 5:
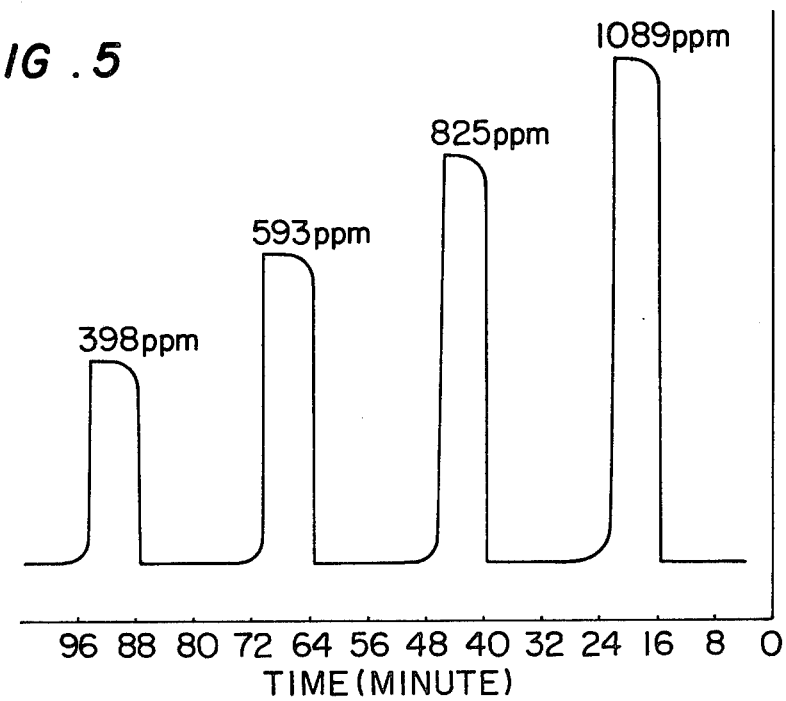
FIG. 5 is a graphical representation indicating the measurement data of $NO_2$ density of a variety of sample gases which are obtained by the device according to this invention.

A variety of sample gases different in $NO_2$ density were continuously measured with the device thus constructed, and the results are as indicated in FIG. 5. It can be understood from the graphical representation in FIG. 5 that the EPR signal strength is proportional to the $NO_2$ density and the continuous measurement can be conducted.

Figure 6:
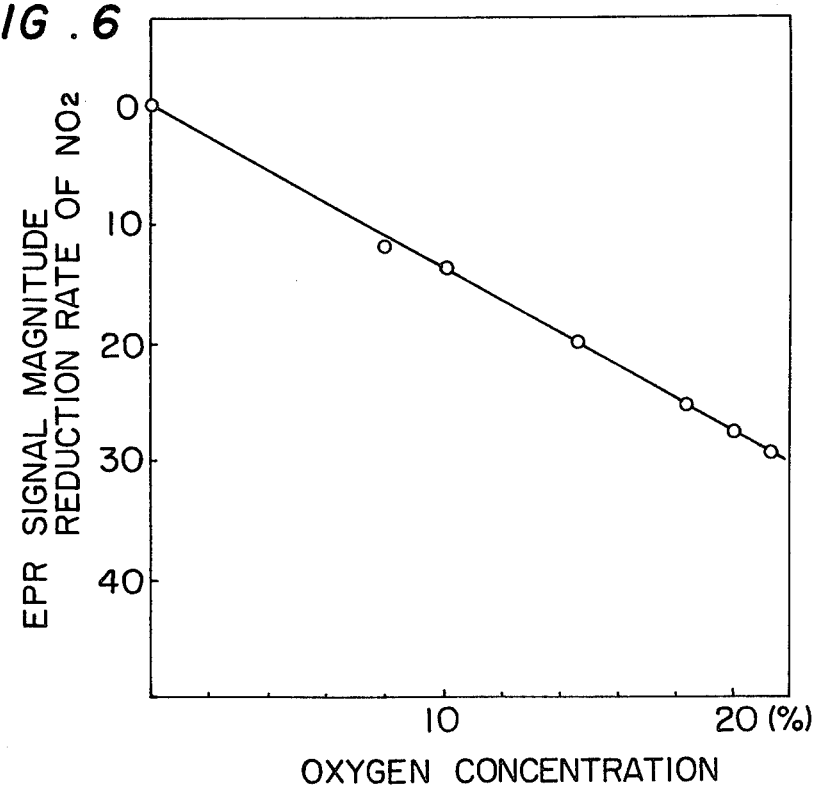
FIG. 6 is also a graphical representation indicating the effect of oxygen to the $NO_2$ measurement by EPR.

In the measurement of $NO_2$ in a boiler exhaust gas with the above-described device, the co-existing oxygen is an obstructing material. In this case, the co-existing oxygen is also measured simultaneously for correction. The effect of oxygen to the $NO_2$ EPR signal is as indicated in FIG. 6. As the $NO_2$ EPR signal decreases in proportion to the density of oxygen the correction can be made.

Figure 7:
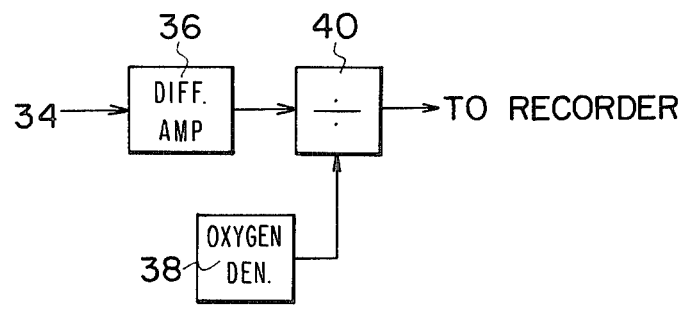
FIG. 7 is a block diagram illustrating a device for eliminating the effect of a co-existing material.
Figure 8:
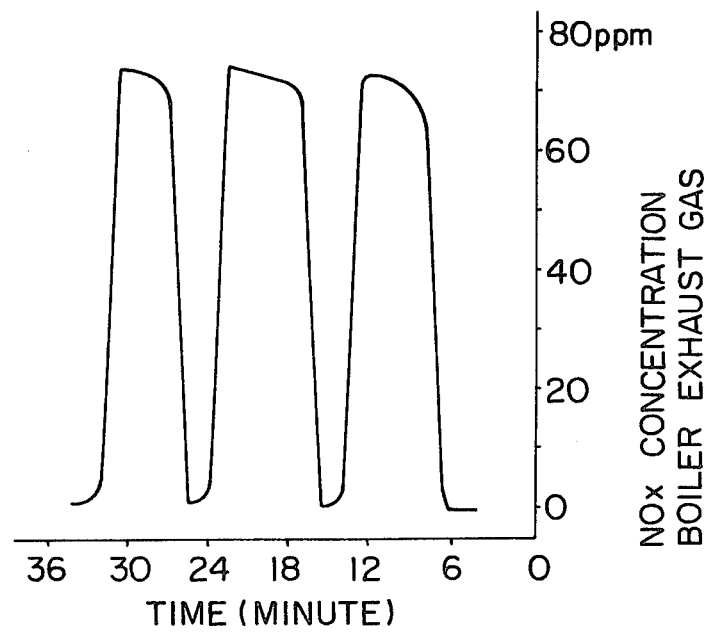
FIG. 8 is a graphical representation indicating the measurement data of $NO_x$ density in a boiler exhaust gas.

Shown in FIG. 7 is a device for correcting the effect of oxygen. With the device shown in FIG. 7, the corrected EPR signals can be continuously obtained by processing the EPR signal of the differential amplifier 36 and the output signal of an oxygen densitometer 38 by means of a divider 40. A result of continuously measuring a boiler exhaust gas with the device thus constructed is shown in FIG. 8. Combustion in a boiler is, in general, intermittently carried out. Accordingly, the boiler employed in this experiment was such that combustion is carried out for six minutes at intervals of three minutes. In addition, in this experiment, NO was oxidized, and continuously measured as the NO and $NO_2$ density.

The EPR measurement which is heretofore carried out intermittently can be substantially continuously carried out according to this invention. This effect is considerably advantageous and convenient not only in the field of physics and chemistry but also in the field of pollution treating technique.

What is claimed is:

1. A method of continuously measuring a gas containing a gas phase paramagnetic material and an obstructing material by electron paramagnetic resonance, of the type in which the difference between the peak outputs of a phase sensitive detector (PSD) occurring at predetermined values of a sweep magnetic field indicates the paramagnetic material density, comprising the steps of continuously introducing said gas into an electron paramagnetic resonance cavity resonator, fixing said sweep magnetic field at two predetermined values at which peak outputs of said PSD are obtained, switching the magnetic field between said two values to detect said outputs at said two values, continuously measuring the density of said obstructing material, continuously obtaining the difference values between the values of the peak outputs thus detected and correcting said difference values by an amount corresponding to the density of said obstructing material.

2. A device for continuously measuring a material by electron paramagnetic resonance, comprising: a cavity resonator having a modulating device such as Stark electrodes or a Zeeman coil, and gas inlet and outlet holes, said cavity resonator being connected to a microwave unit; electromagnet means for placing said cavity resonator in a uniform magnetic field; a magnetic field sweep device for sweeping a magnetic field generated by said electromagnet means; a current source for supplying current controlled by said magnetic field sweep device to said electromagnet means; a phase sensitive detector connected to said modulating device; a square wave generator connected to said sweep device for controlling said sweep device so as to cause said electromagnet means to alternately provide two predetermined magnetic field strengths; and a device connected to the output of said phase sensitive detector for generating the difference between the outputs observed at said two magnetic field intensities in synchronization with the operation of said square wave generator.

3. A device as claimed in claim 2, further comprising a device for correcting said electron paramagnetic resonance signal with the density of a co-existed obstructing material.

4. In an electron paramagnetic resonance (EPR) method of measuring the density of a paramagnetic material in a gas phase, said method being of the type in which the gas is subjected to a magnetic field of changing strength within a microwave cavity resonator while said resonator is supplied with a constant frequency microwave signal, and in which upper and lower peak amplitude values in the output of a phase sensitive detector (PSD) coupled to said resonator are substracted from one another to obtain a representation of the density of said paramagnetic material, said upper and lower peak amplitude values occuring at first and second magnetic field strengths $H_1$ and $H_2$, respectively, the improvement comprising:

alternatively switching the magnetic field strength between said two values $H_1$ and $H_2$.

* * * * *